(12) United States Patent
Chung et al.

(10) Patent No.: US 10,066,821 B1
(45) Date of Patent: Sep. 4, 2018

(54) LIGHT-EMITTING DEVICE HAVING AN AMBIENT LIGHT SENSING FUNCTION

(71) Applicant: PARAGON SEMICONDUCTOR LIGHTING TECHNOLOGY CO., LTD., New Taipei (TW)

(72) Inventors: Chia-Tin Chung, Miaoli County (TW); Shih-Neng Tai, Taoyuan County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/712,825

(22) Filed: Sep. 22, 2017

(30) Foreign Application Priority Data

Mar. 1, 2017 (TW) .............................. 106202868 U (51) Int. Cl.
| | |
|---|---|
| *H05B 37/02* | (2006.01) |
| *F21V 23/06* | (2006.01) |
| *F21V 23/04* | (2006.01) |
| *H05B 33/08* | (2006.01) |
| *F21V 19/00* | (2006.01) |

(52) U.S. Cl.
CPC ........ *F21V 23/0464* (2013.01); *F21V 19/003* (2013.01); *F21V 23/06* (2013.01); *H05B 33/0845* (2013.01); *H05B 37/0218* (2013.01)

(58) Field of Classification Search
CPC ............ H05B 37/0272; H05B 37/0218; H05B 33/0842; H05B 37/0227; H05B 33/0845; H05B 37/0254; H05B 37/02; H05B 33/0815; H05B 33/0803; H05B 33/0812; F21Y 2115/10; F21Y 2113/005; F21Y 2105/003; Y02B 20/46; Y02B 20/48; Y02B 20/343; F21V 23/0464; F21V 23/06; F21V 19/003
See application file for complete search history.

(56) References Cited

U.S. PATENT DOCUMENTS

| | | | | |
|---|---|---|---|---|
| 8,405,315 B2 * | 3/2013 | Tsai | .................. | H05B 37/0218 |
| | | | | 315/149 |
| 8,415,701 B2 * | 4/2013 | Chung | ................ | H01L 25/0753 |
| | | | | 257/100 |

(Continued)

*Primary Examiner* — Vibol Tan
(74) *Attorney, Agent, or Firm* — Li & Cai Intellectual Property (USA) Office (57) ABSTRACT

The present disclosure provides a light-emitting device having an ambient light sensing function, including a light-emitting module, a rectification module, a switch module, a control module, and an ambient light sensing module. The light-emitting module includes a circuit substrate and a plurality of light-emitting elements. The rectification module is electrically connected to the light-emitting module. The switch module includes a semiconductor switch element electrically connected to the light-emitting module. The control module is electrically connected to the rectification module and the switch module. The ambient light sensing module is electrically connected to the control module for receiving an ambient light source. The ambient light sensing module provides a light intensity signal to the control module according to a light intensity provided by the ambient light source, and the light-emitting elements are turned on or turned off by the semiconductor switch element according to the light intensity signal.

9 Claims, 5 Drawing Sheets

(56) References Cited

U.S. PATENT DOCUMENTS

| | | | |
|---|---|---|---|
| 8,672,517 B2* | 3/2014 | Chung | F21V 29/20 |
| | | | 257/100 |
| 8,742,694 B2* | 6/2014 | Bora | H05B 33/0863 |
| | | | 315/113 |
| 8,899,789 B2* | 12/2014 | Chung | F21V 19/003 |
| | | | 362/249.02 |
| 9,451,662 B1* | 9/2016 | Chung | H05B 33/0854 |
| 9,572,226 B2* | 2/2017 | Motley | H05B 37/02 |
| 9,795,016 B2* | 10/2017 | Motley | H05B 37/0272 |
| 9,877,365 B1* | 1/2018 | Chung | H05B 33/0815 |

* cited by examiner

LIGHT-EMITTING DEVICE HAVING AN AMBIENT LIGHT SENSING FUNCTION

FIELD OF THE INVENTION

The present disclosure relates to a light-emitting device, and more particularly to a light-emitting device having an ambient light sensing function.

BACKGROUND OF THE INVENTION

Compared with traditional light sources, light emitting diodes (LEDs) have the advantages of a smaller size, better power saving, better light-emitting efficiency, a longer service life, a faster transient response, and causing no heat radiation or pollution from toxic substances such as mercury. In recent years, light emitting diodes have been widely used in many applications. Due to their insufficient brightness, light emitting diodes were unable to replace traditional light sources in the past. However, through the continuous upgrade of relevant technology, light-emitting diodes with high luminance and high power that are sufficient to replace traditional light sources have been developed. Nevertheless, conventional light emitting devices all use mechanical switches to control the light emitting device, thus still leaving room for improvement in terms of the art.

SUMMARY OF THE INVENTION

One aspect of the present disclosure relates to a light-emitting device having an ambient light sensing function.

One of the embodiments of the present disclosure provides a light-emitting device having an ambient light sensing function, including a light-emitting module, a rectification module, a switch module, a control module, and an ambient light sensing module. The light-emitting module includes a circuit substrate and a plurality of light-emitting elements disposed on the circuit substrate and electrically connected to the circuit substrate. The rectification module is electrically connected to the light-emitting module. The switch module includes a semiconductor switch element electrically connected to the light-emitting module. The control module is electrically connected to the rectification module and the switch module. The ambient light sensing module is electrically connected to the control module for receiving an ambient light source. The ambient light sensing module provides a light intensity signal to the control module according to a light intensity provided by the ambient light source, and the light-emitting elements are turned on or turned off by the semiconductor switch element of the switch module according to the light intensity signal.

Another one of the embodiments of the present disclosure provides a light-emitting device having an ambient light sensing function, including a light-emitting module, a rectification module, a switch module, a control module, an ambient light sensing module, and a flash frequency adjusting module. The light-emitting module includes a circuit substrate and a plurality of light-emitting elements disposed on the circuit substrate and electrically connected to the circuit substrate. The rectification module is electrically connected to the light-emitting module. The switch module includes a semiconductor switch element electrically connected to the light-emitting module. The control module is electrically connected to the rectification module and the switch module. The ambient light sensing module is electrically connected to the control module for receiving an ambient light source. The ambient light sensing module provides a light intensity signal to the control module according to a light intensity provided by the ambient light source. The flash frequency adjusting module is electrically connected to the control module. The flash frequency adjusting module includes a flash frequency switch, the flash frequency adjusting module provides a flash frequency signal to the control module according to a predetermined flash frequency provided by the flash frequency switch, and the light-emitting elements are flashed at the predetermined flash frequency by the semiconductor switch element of the control module according to the flash frequency signal.

Yet another one of the embodiments of the present disclosure provides a light-emitting device having an ambient light sensing function, including a light-emitting module, a rectification module, a switch module, a control module, and an ambient light sensing module. The light-emitting module includes a plurality of light-emitting elements. The rectification module is electrically connected to the light-emitting module and an external power supply. The switch module includes a semiconductor switch element electrically connected to the light-emitting module. The control module is electrically connected to the rectification module and the switch module. The ambient light sensing module is electrically connected to the control module for providing a light intensity signal according to an ambient light source. The light-emitting elements are turned on or turned off by the semiconductor switch element of the switch module according to the light intensity signal.

Therefore, by matching the features of "the switch module including a semiconductor switch element electrically connected to the light-emitting module" and "the ambient light sensing module being electrically connected to the control module for providing a light intensity signal according to an ambient light source", the light-emitting elements are turned on or turned off by the semiconductor switch element of the switch module according to the light intensity signal.

To further understand the techniques, means and effects of the present disclosure applied for achieving the prescribed objectives, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

DETAILED DESCRIPTION OF THE PREFERRED EMBODIMENTS

The embodiments of a light-emitting device having an ambient light sensing function of the present disclosure are described. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Figure 1:
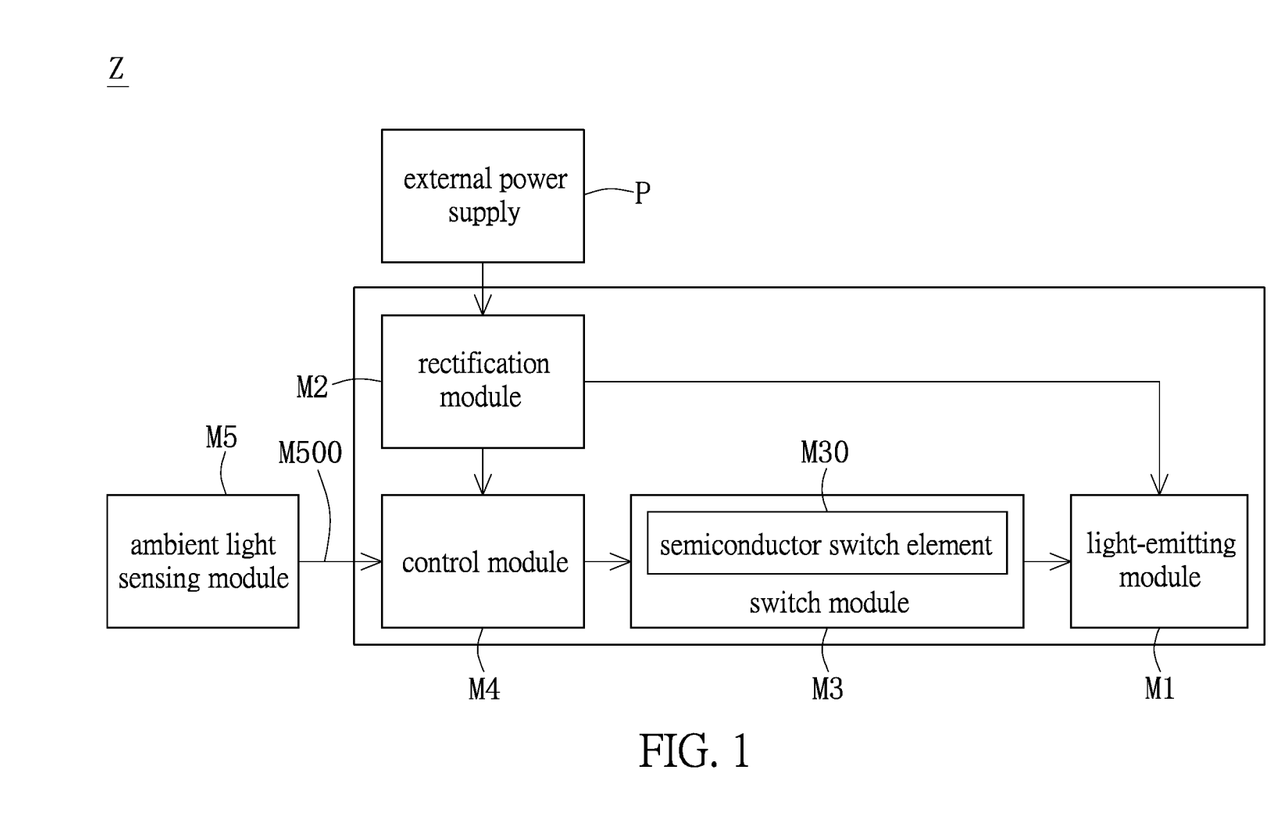
FIG. 1 shows a function block diagram of the light-emitting device having an ambient light sensing function according to the first embodiment of the present disclosure.

Referring to FIG. 1, the first embodiment of the present disclosure provides a light-emitting device Z having an ambient light sensing function including: a light-emitting module M1, a rectification module M2, a switch module M3, a control module M4, and an ambient light sensing module M5.

Figure 2:
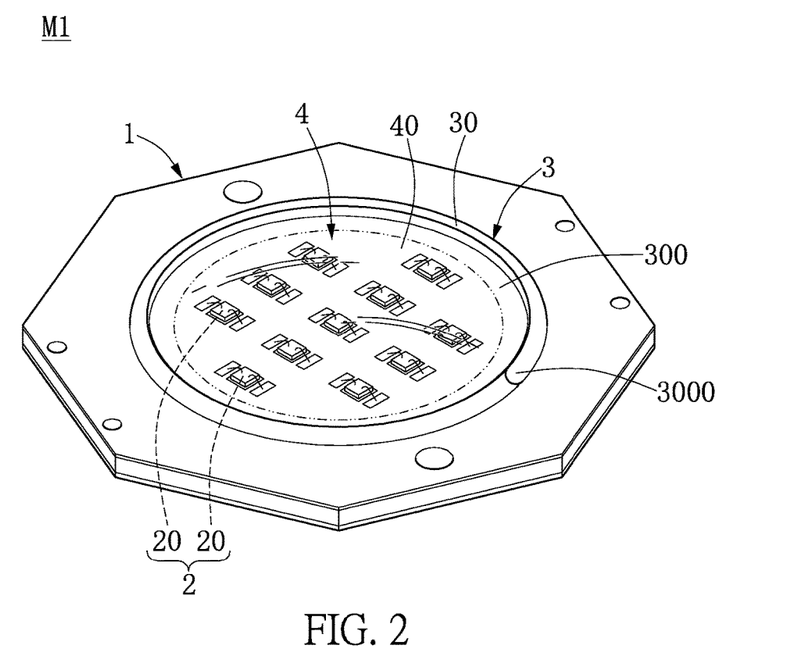
FIG. 2 shows a schematic perspective view of one of light-emitting modules of the light-emitting device according to the first embodiment of the present disclosure.
Figure 3:
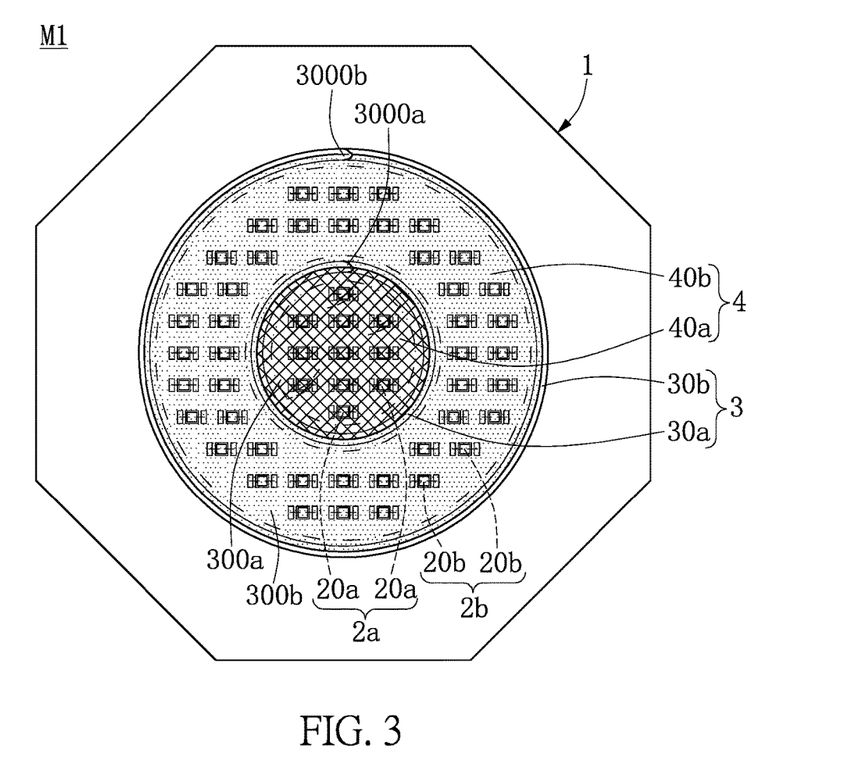
FIG. 3 shows a schematic perspective view of another one of light-emitting modules of the light-emitting device according to the first embodiment of the present disclosure.

Firstly, referring to FIG. 1 to FIG. 3, the light-emitting module M1 includes a circuit substrate 1 and a light-emitting unit 2 disposed on the circuit substrate 1 and electrically connected to the circuit substrate 1. The light-emitting unit 2 includes a plurality of light-emitting elements 20 disposed on the circuit substrate 1 and electrically connected to the circuit substrate 1. It should be noted that all of the rectification module M2, the switch module M3 and the control module M4 are disposed on the circuit substrate 1 of the light-emitting module M1, so that the light-emitting module M1, the rectification module M2, the switch module M3 and the control module M4 can be combined to form a single assembly. In addition, the ambient light sensing module M5 is electrically connected to the circuit substrate 1 through a conductive wire, so that the single assembly and the ambient light sensing module M5 are separated from each other by a predetermined distance.

In one example of the first embodiment, as shown in FIG. 2, each of the light-emitting elements 20 may be a light-emitting diode (LED) chip. Moreover, the light-emitting module M1 further includes a frame unit 3 and a package unit 4. The frame unit 3 includes a surrounding light-reflecting resin body 30 surroundingly coated on the top surface of the circuit substrate 1. The surrounding light-reflecting resin body 30 surrounds the light-emitting unit 2 to form a resin position limiting space 300 on the circuit substrate 1, and the surrounding light-reflecting resin body 30 has a convex junction portion 3000 (or a concave junction portion) formed on a top surface thereof. Regarding the formation of the convex junction portion 3000 (or the concave junction portion), when the surrounding light-reflecting resin body 30 is formed from a starting location to a finishing location (near the end of surrounding coating process), the convex junction portion 3000 (or the concave junction portion) is formed naturally on the surrounding light-reflecting resin body 30. Moreover, the package unit 4 includes a light-transmitting resin body 40 disposed on the top surface of the circuit substrate 1 for enclosing or encapsulating the light-emitting unit 2, and the light-transmitting resin body 40 is disposed inside the resin position limiting space 300 and surrounded by the surrounding light-reflecting resin body 30. It is noted that phosphors or fluorescent powders which can transform a wave length of the visible light (such as blue light) from the light-emitting elements 20 to a wave length (such as 820 nm) of non-visible light (such as red light) can be added into the light-transmitting resin body 40 so that the non-visible light from the light-emitting elements 20 can only be seen by users who wear night vision goggles.

Figure 4:
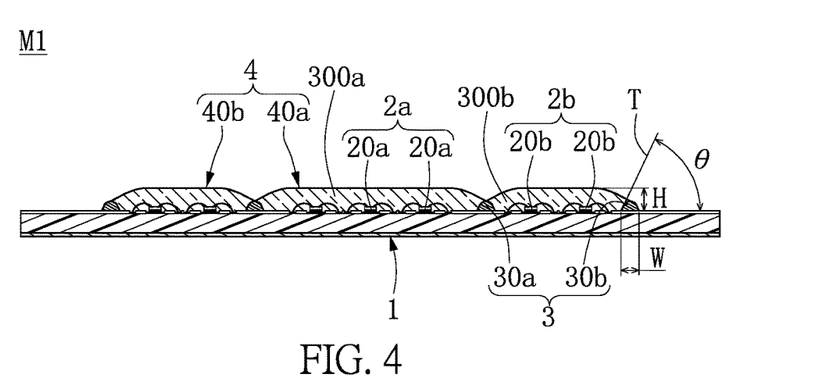
FIG. 4 shows a schematic cross-sectional view of another one of light-emitting modules of the light-emitting device according to the first embodiment of the present disclosure.

In another example of the first embodiment, as shown in FIG. 3 and FIG. 4, the light-emitting elements 20 are divided into a first light-emitting group 2a and a second light-emitting group 2b. In addition, the light-emitting module M1 further includes a frame unit 3 and a package unit 4. The frame unit 3 includes a first surrounding light-reflecting resin body 30a surroundingly coated on the top surface of the circuit substrate 1 and a second surrounding light-reflecting resin body 30b surroundingly coated on the top surface of the circuit substrate 1 for surrounding the first surrounding light-reflecting resin body 30a. The first surrounding light-reflecting resin body 30a surrounds the first light-emitting group 2a to form a first resin position limiting space 300a on the circuit substrate 1. The second surrounding light-reflecting resin body 30b surrounds the second light-emitting group 2b and the first surrounding light-reflecting resin body 30a to form a second resin position limiting space 300b on the circuit substrate 1 and between the first surrounding light-reflecting resin body 30a and the second surrounding light-reflecting resin body 30b. Furthermore, the package unit 4 includes a first light-transmitting resin body 40a and a second light-transmitting resin body 40b disposed on the top surface of the circuit substrate 1 to respectively enclose the first light-emitting group 2a and the second light-emitting group 2b. The first light-transmitting resin body 40a and the second light-transmitting resin body 40b are respectively disposed inside the first resin position limiting space 300a and the second resin position limiting space 300b and respectively surrounded by the first surrounding light-reflecting resin body 30a and the second surrounding light-reflecting resin body 30b.

As described above, as shown in FIG. 3, the first light-emitting group 2a includes a plurality of first light-emitting elements 20a disposed on the circuit substrate 1 and electrically connected to the circuit substrate 1, and the second light-emitting group 2b includes a plurality of second light-emitting elements 20b disposed on the circuit substrate 1 and electrically connected to the circuit substrate 1. The first light-emitting group 2a and the second light-emitting group 2b may be LED chips. In addition, the first surrounding light-reflecting resin body 30a and the second surrounding light-reflecting resin body 30b are arranged in a pattern of concentric circles, the second light-emitting group 2b is disposed between the first surrounding light-reflecting resin body 30a and the second surrounding light-reflecting resin body 30b, and the second light-emitting group 2b surrounds the first surrounding light-reflecting resin body 30a. Furthermore, the first surrounding light-reflecting resin body 30a has a first convex junction portion 3000a (or a first concave junction portion), and the second surrounding light-reflecting resin body 30b has a second convex junction portion 3000b (or a second concave junction portion). In other words, when the surrounding coating process of forming the first surrounding light-reflecting resin body 30a (or the second surrounding light-reflecting resin body 30b) is about to finish, the first convex junction portion 3000a (or the second concave junction portion 3000b) will be formed naturally.

As described above, referring to FIG. 3 and FIG. 4, the method for forming the first surrounding light-reflecting resin body 30a (or the second surrounding light-reflecting resin body 30b) includes the following steps. Firstly, liquid colloid (not shown) is surroundingly coated on the top surface of the circuit substrate 1, wherein the liquid colloid can be coated on the circuit substrate 1 to form any shapes (such as a circular shape, a square, or a rectangular shape) according to different requirements. The thixotropic index of the liquid colloid may be between 4 and 6, the pressure of coating the liquid colloid on the top surface of the circuit substrate 1 may be between 350 kpa and 450 kpa, and the velocity of coating the liquid colloid on the top surface of the circuit substrate 1 may be between 5 mm/s and 15 mm/s. The liquid colloid is surroundingly coated on the top surface of the circuit substrate 1 from an initial point to a terminal point, and the position of the initial point and the position of the terminal point are substantially the same or overlapped, so that the initial point and the terminal point have a resin structure with a slightly protruding portion (the first convex junction portion 3000a or the second concave junction portion 3000b). Furthermore, the liquid colloid is hardened or cured to form a first surrounding light-reflecting resin body 30a wherein, the liquid colloid is hardened by baking or curing, the baking temperature may be between 120□ and 140□, and the baking time may be between 20 minutes and 40 minutes. Therefore, the top surface of the first surrounding light-reflecting resin body 30a (or the second surrounding light-reflecting resin body 30b) has an arc shape, the first surrounding light-reflecting resin body 30a (or the second surrounding light-reflecting resin body 30b) has a radius tangent T and the angle θ of the radius tangent T relative to the top surface of the circuit substrate 1 may be between 40° and 50°, the maximum height H of the first surrounding light-reflecting resin body 30a (or the second surrounding light-reflecting resin body 30b) relative to the top surface of the circuit substrate 1 may be between 0.3 mm and 0.7 mm, the width W of the bottom side of the first surrounding light-reflecting resin body 30a (or the second surrounding light-reflecting resin body 30b) may be between 1.5 mm and 3 mm, the thixotropic index of the first surrounding light-reflecting resin body 30a (or the second surrounding light-reflecting resin body 30b) may be between 4 and 6, and the first surrounding light-reflecting resin body 30a (or the second surrounding light-reflecting resin body 30b) is a white thermohardening resin with inorganic additive particles inside.

Furthermore, referring to FIG. 1 and FIG. 2, the rectification module M2 is electrically connected to the light-emitting module M1 and an external power supply P such as a DC power source. For example, the rectification module M2 may be a bridge rectifier or a rectification chip, and the external power supply P may be a household power supply with a voltage from 100 volts to 240 volts. In addition, the switch module M3 includes a semiconductor switch element M30 electrically connected to the light-emitting module M1. For example, the semiconductor switch element M30 of the switch module M3 may be a metal-oxide-semiconductor field effect transistor (MOSFET) chip with a control program, and the semiconductor switch element M30 can be used to turn on or turn off a power source through the MOSFET. Moreover, the control module M4 is electrically connected to the rectification module M2 and the switch module M3. For example, the control module M4 may be a micro controller (MCU) or any type of semiconductor controller.

More particularly, the ambient light sensing module M5 is electrically connected to the control module M4. When the ambient light sensing module M5 is used to receive an ambient light source, the ambient light sensing module M5 can provide a light intensity signal M500 to the control module M4 according to a light intensity provided by the ambient light source. Therefore, the light-emitting elements 20 can be turned on or turned off by the semiconductor switch element M30 of the switch module M3 according to the light intensity signal M500. That is to say, the ambient light sensing module M5 is electrically connected to the control module M4 for providing a light intensity signal M500 according to an ambient light source, so that the light-emitting elements 20 can be turned on or turned off by the semiconductor switch element M30 of the switch module M3 according to the light intensity signal M500.

For example, the ambient light sensing module M5 can be a photoresistor or any other kind of photo detector. When the light-emitting device Z is used during daytime, since the light intensity of the ambient light source received by the ambient light sensing module M5 is stronger, the semiconductor switch element M30 can turn off the light-emitting elements 20 according to the light intensity signal M500. When the light-emitting device Z is used at night, since the light intensity of the ambient light source received by the ambient light sensing module M5 is weaker, the semiconductor switch element M30 can turn on the light-emitting elements 20 according to the light intensity signal M500. In other words, the light-emitting elements 20 can be turned on or turned off through the control of the semiconductor switch element M30 according to the light intensity signal M500 provided by the ambient light sensing module M5.

Second Embodiment

Figure 5:
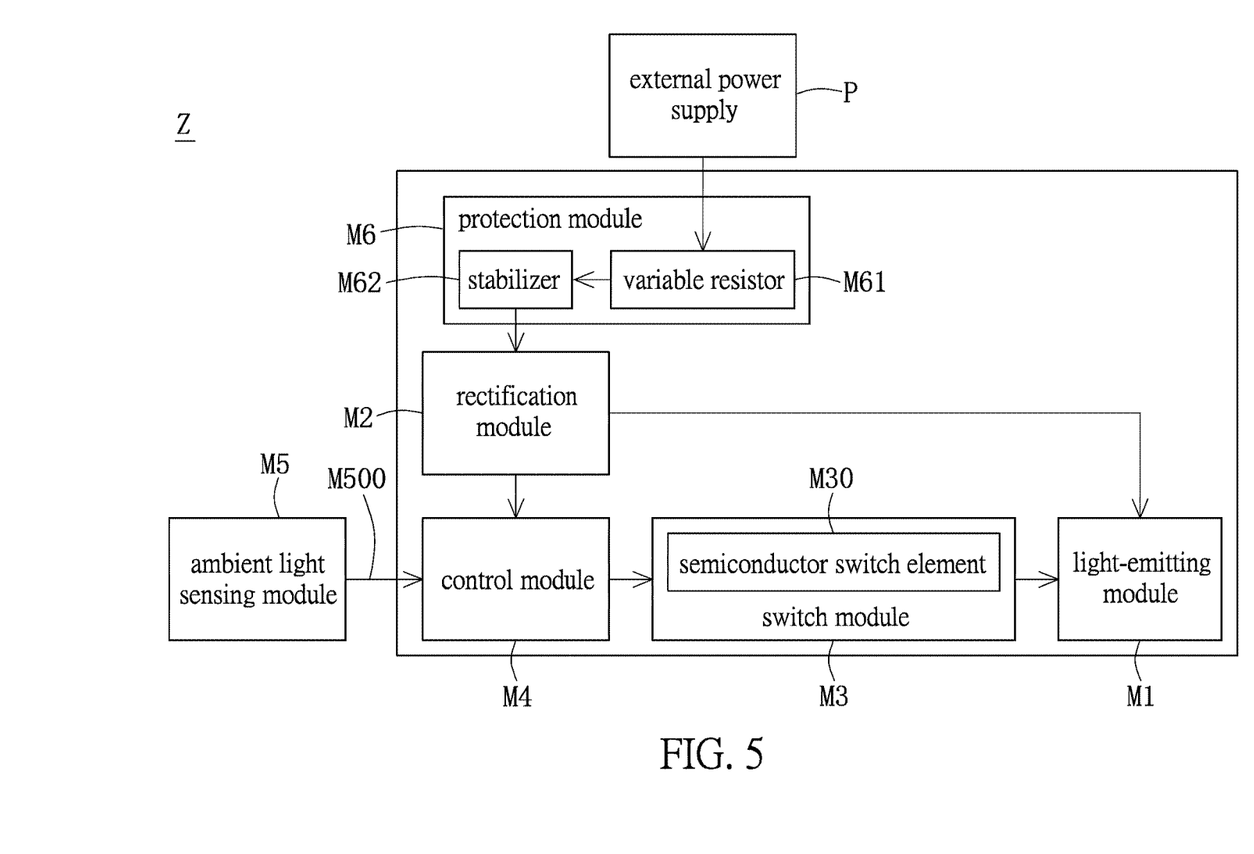
FIG. 5 shows a function block diagram of the light-emitting device having an ambient light sensing function according to the second embodiment of the present disclosure.

Referring to FIG. 5, the second embodiment of the present disclosure provides a light-emitting device Z having an ambient light sensing function including: a light-emitting module M1, a rectification module M2, a switch module M3, a control module M4, and an ambient light sensing module M5. Comparing FIG. 5 with FIG. 1, the difference between the second embodiment and the first embodiment is as follows: the light-emitting device Z of the second embodiment further includes a protection module M6 including a variable resistor M61 electrically connected to an external power supply P, and a stabilizer M62 electrically connected between the variable resistor M61 and the rectification module M2. That is to say, an electric power generated by the external power supply P can be transmitted to the rectification module M2 through the variable resistor M61 and the stabilizer M62 in sequence.

Third Embodiment

Figure 6:
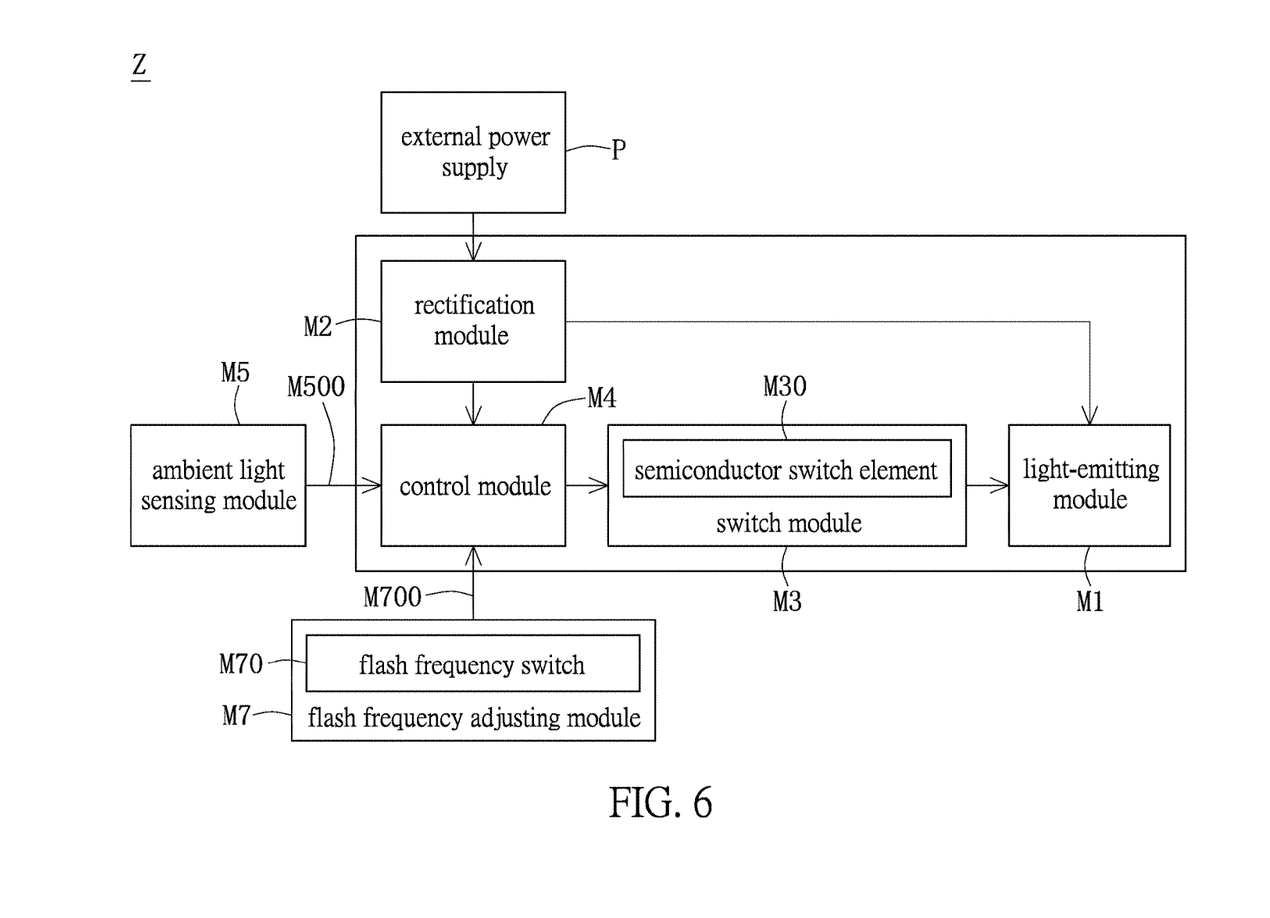
FIG. 6 shows a function block diagram of the light-emitting device having an ambient light sensing function according to the third embodiment of the present disclosure.

Referring to FIG. 6, the third embodiment of the present disclosure provides a light-emitting device Z having an ambient light sensing function including: a light-emitting module M1, a rectification module M2, a switch module M3, a control module M4, and an ambient light sensing module M5. Comparing FIG. 6 with FIG. 1, the difference between the third embodiment and the first embodiment is as follows: the light-emitting device Z of the third embodiment further includes a flash frequency adjusting module M7.

As shown in FIG. 6, the flash frequency adjusting module M7 is electrically connected to the control module M4, and the flash frequency adjusting module M7 includes a flash frequency switch M70. More particularly, the flash frequency adjusting module M7 can provide a predetermined flash frequency signal M700 to the control module M4 according to a predetermined flash frequency provided by the flash frequency switch M70. Furthermore, the semiconductor switch element M30 of the control module M4 can control the light-emitting elements 20 to flash at the predetermined flash frequency and a predetermined time according to the flash frequency signal M700. In other words, the light-emitting elements 20 can flash at a predetermined flash frequency and a predetermined time through the control of the semiconductor switch element M30 according to the flash frequency signal M700 from the flash frequency adjusting module M7.

For example, the flash frequency switch M70 is used to set a flash frequency of the light-emitting element 20 to be three times. When the light-emitting device Z is electrically connected to the external power supply P, the light-emitting element 20 can have three flashes through the control of the semiconductor switch element M30. Such a manner facilitates the user to confirm the correctness in the installation of the light-emitting device Z under whatever circumstances; for instance, the confirmation on whether the light-emitting device Z is electrically connected to the external power supply P normally, or whether the flash frequency adjusting module M7 remains intact.

Therefore, by matching the features of "the switch module M3 including a semiconductor switch element M30 electrically connected to the light-emitting module M1" and "the ambient light sensing module M5 being electrically connected to the control module M4 for providing a light intensity signal M500 according to an ambient light source", the light-emitting elements 20 can be turned on or turned off by the semiconductor switch element M30 of the switch module M3 according to the light intensity signal M500.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A light-emitting device having an ambient light sensing function, comprising:
   a light-emitting module including a circuit substrate and a plurality of light-emitting elements disposed on the circuit substrate and electrically connected to the circuit substrate;
   a rectification module electrically connected to the light-emitting module;
   a switch module including a semiconductor switch element electrically connected to the light-emitting module;
   a control module electrically connected to the rectification module and the switch module;
   an ambient light sensing module electrically connected to the control module for receiving an ambient light source, and
   a protection module including a variable resistor electrically connected to an external power supply, and a stabilizer electrically connected between the variable resistor and the rectification module;
   wherein the ambient light sensing module provides a light intensity signal to the control module according to a light intensity provided by the ambient light source, and the light-emitting elements are turned on or turned off by the semiconductor switch element of the switch module according to the light intensity signal.

2. The light-emitting device of claim 1, wherein the light-emitting module includes:
   a frame unit having a surrounding light-reflecting resin body surroundingly coated on the circuit substrate, wherein the surrounding light-reflecting resin body surrounds the light-emitting elements to form a limiting space on the circuit substrate, and the surrounding light-reflecting resin body has a convex junction portion; and
   a package unit having a light-transmitting resin body disposed on the circuit substrate for enclosing the light-emitting elements, wherein the light-transmitting resin body is disposed inside the limiting space and surrounded by the surrounding light-reflecting resin body.

3. The light-emitting device of claim 1, wherein the light-emitting elements are divided into a first light-emitting group and a second light-emitting group, and the light-emitting module includes:
   a frame unit having a first surrounding light-reflecting resin body surroundingly coated on the circuit substrate and a second surrounding light-reflecting resin body surroundingly coated on the circuit substrate for surrounding the first surrounding light-reflecting resin body, wherein the first surrounding light-reflecting resin body surrounds the first light-emitting group to form a first limiting space, the second surrounding light-reflecting resin body surrounds the second light-emitting group and the first surrounding light-reflecting resin body to form a second limiting space between the first surrounding light-reflecting resin body and the second surrounding light-reflecting resin body, the first surrounding light-reflecting resin body has a first convex junction portion and the second surrounding light-reflecting resin body has a second convex junction portion; and
   a package unit having a first light-transmitting resin body enclosing the first light-emitting group on the circuit substrate and a second light-transmitting resin body enclosing the first light-emitting group on the circuit substrate, wherein the first light-transmitting resin body and the second light-transmitting resin body are surrounded by the first surrounding light-reflecting resin body and the second surrounding light-reflecting resin body respectively and disposed inside the first limiting space and the second limiting space respectively.

4. A light-emitting device having an ambient light sensing function, comprising:
   a light-emitting module including a circuit substrate and a plurality of light-emitting elements disposed on the circuit substrate and electrically connected to the circuit substrate;
   a rectification module electrically connected to the light-emitting module;
   a switch module including a semiconductor switch element electrically connected to the light-emitting module;
   a control module electrically connected to the rectification module and the switch module;
   an ambient light sensing module electrically connected to the control module for receiving an ambient light source, wherein the ambient light sensing module provides a light intensity signal to the control module according to a light intensity provided by the ambient light source; and a flash frequency adjusting module electrically connected to the control module, wherein the flash frequency adjusting module includes a flash frequency switch, the flash frequency adjusting module provides a flash frequency signal to the control module according to a predetermined flash frequency provided by the flash frequency switch, and the light-emitting elements are flashed at the predetermined flash frequency by the semiconductor switch element of the control module according to the flash frequency signal.

5. The light-emitting device of claim 4, wherein the light-emitting module includes:
  a frame unit having a surrounding light-reflecting resin body surroundingly coated on the circuit substrate, wherein the surrounding light-reflecting resin body surrounds the light-emitting elements to form a limiting space on the circuit substrate, and the surrounding light-reflecting resin body has a convex junction portion; and
  a package unit having a light-transmitting resin body disposed on the circuit substrate for enclosing the light-emitting elements, wherein the light-transmitting resin body is disposed inside the limiting space and surrounded by the surrounding light-reflecting resin body.

6. The light-emitting device of claim 4, wherein the light-emitting elements are divided into a first light-emitting group and a second light-emitting group, and the light-emitting module includes:
  a frame unit having a first surrounding light-reflecting resin body surroundingly coated on the circuit substrate and a second surrounding light-reflecting resin body surroundingly coated on the circuit substrate for surrounding the first surrounding light-reflecting resin body, wherein the first surrounding light-reflecting resin body surrounds the first light-emitting group to form a first limiting space, the second surrounding light-reflecting resin body surrounds the second light-emitting group and the first surrounding light-reflecting resin body to form a second limiting space between the first surrounding light-reflecting resin body and the second surrounding light-reflecting resin body, the first surrounding light-reflecting resin body has a first convex junction portion and the second surrounding light-reflecting resin body has a second convex junction portion; and
  a package unit having a first light-transmitting resin body enclosing the first light-emitting group on the circuit substrate and a second light-transmitting resin body enclosing the first light-emitting group on the circuit substrate, wherein the first light-transmitting resin body and the second light-transmitting resin body are surrounded by the first surrounding light-reflecting resin body and the second surrounding light-reflecting resin body respectively and disposed inside the first limiting space and the second limiting space respectively.

7. A light-emitting device having an ambient light sensing function, comprising:
  a light-emitting module including a plurality of light-emitting elements;
  a rectification module electrically connected to the light-emitting module and an external power supply;
  a switch module including a semiconductor switch element electrically connected to the light-emitting module;
  a control module electrically connected to the rectification module and the switch module;
  an ambient light sensing module electrically connected to the control module for providing a light intensity signal according to an ambient light source; and
  a protection module including a variable resistor electrically connected to an external power supply, and a stabilizer electrically connected between the variable resistor and the rectification module;
  wherein the light-emitting elements are turned on or turned off by the semiconductor switch element of the switch module according to the light intensity signal.

8. The light-emitting device of claim 7, wherein the light-emitting module includes:
  a frame unit having a surrounding light-reflecting resin body surroundingly coated on the circuit substrate, wherein the surrounding light-reflecting resin body surrounds the light-emitting elements to form a limiting space on the circuit substrate, and the surrounding light-reflecting resin body has a convex junction portion; and
  a package unit having a light-transmitting resin body disposed on the circuit substrate for enclosing the light-emitting elements, wherein the light-transmitting resin body is disposed inside the limiting space and surrounded by the surrounding light-reflecting resin body.

9. The light-emitting device of claim 7, wherein the light-emitting elements are divided into a first light-emitting group and a second light-emitting group, and the light-emitting module includes:
  a frame unit having a first surrounding light-reflecting resin body surroundingly coated on the circuit substrate and a second surrounding light-reflecting resin body surroundingly coated on the circuit substrate for surrounding the first surrounding light-reflecting resin body, wherein the first surrounding light-reflecting resin body surrounds the first light-emitting group to form a first limiting space, the second surrounding light-reflecting resin body surrounds the second light-emitting group and the first surrounding light-reflecting resin body to form a second limiting space between the first surrounding light-reflecting resin body and the second surrounding light-reflecting resin body, the first surrounding light-reflecting resin body has a first convex junction portion and the second surrounding light-reflecting resin body has a second convex junction portion; and
  a package unit having a first light-transmitting resin body enclosing the first light-emitting group on the circuit substrate and a second light-transmitting resin body enclosing the first light-emitting group on the circuit substrate, wherein the first light-transmitting resin body and the second light-transmitting resin body are surrounded by the first surrounding light-reflecting resin body and the second surrounding light-reflecting resin body respectively and disposed inside the first limiting space and the second limiting space respectively.

* * * * *